United States Patent
Lee et al.

(10) Patent No.: US 7,259,399 B2
(45) Date of Patent: Aug. 21, 2007

(54) VERTICAL GAN-BASED LED AND METHOD OF MANUFACTURING THE SAME

(75) Inventors: Jae Hoon Lee, Suwon (KR); Hee Seok Choi, Seoul (KR); Jeong Tak Oh, Suwon (KR); Su Yeol Lee, Suwon (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 11/490,231

(22) Filed: Jul. 21, 2006

(65) Prior Publication Data

US 2007/0018177 A1 Jan. 25, 2007

(30) Foreign Application Priority Data

Jul. 22, 2005 (KR) .................. 10-2005-0066616

(51) Int. Cl.
*H01L 29/22* (2006.01)
*H01L 29/24* (2006.01)

(52) U.S. Cl. .................. 257/94; 257/103; 257/79; 257/85; 257/200; 257/201; 257/189; 438/22; 438/46; 438/47

(58) Field of Classification Search .......... 257/94, 257/103, 79, 85, 200, 201, 189; 438/22, 438/46, 47
See application file for complete search history.

(56) References Cited

U.S. PATENT DOCUMENTS 6,455,877 B1 9/2002 Ogawa et al.
2003/0214807 A1* 11/2003 Liu ........................ 362/100

FOREIGN PATENT DOCUMENTS

JP 2005-183930 A 7/2005
WO WO99/46822 9/1999

* cited by examiner

*Primary Examiner*—Jerome Jackson
*Assistant Examiner*—Joseph Nguyen
(74) *Attorney, Agent, or Firm*—McDermott Will & Emery LLP

(57) ABSTRACT

Provided are a vertical GaN-based LED and a method of manufacturing the same. The vertical GaN-based LED includes an n-electrode. An AlGaN layer is formed under the n-electrode. An undoped GaN layer is formed under the AlGaN layer to provide a two-dimensional electron gas layer to a junction interface of the AlGaN layer. A GaN-based LED structure includes an n-type GaN layer, an active layer, and a p-type GaN layer that are sequentially formed under the undoped GaN layer. A p-electrode is formed under the GaN-based LED structure. A conductive substrate is formed under the p-electrode.

10 Claims, 3 Drawing Sheets

[FIG. 1]
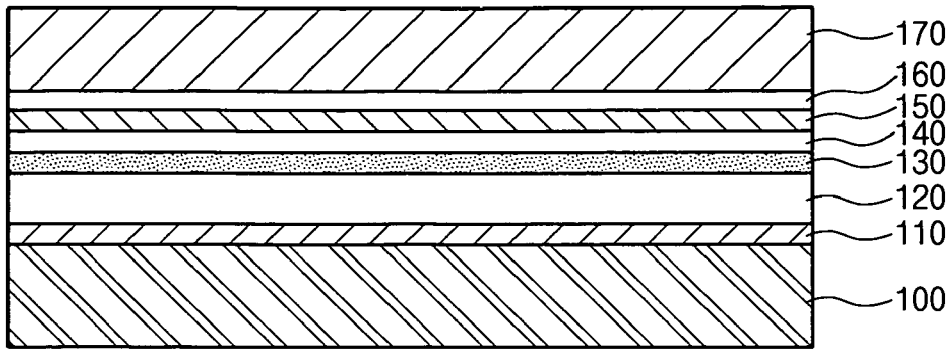
[FIG. 2]
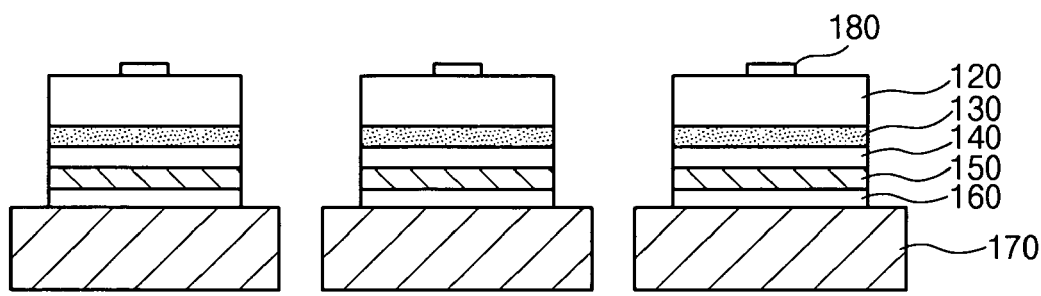
[FIG. 3]
(a)                      (b)
N-face                Ga-face
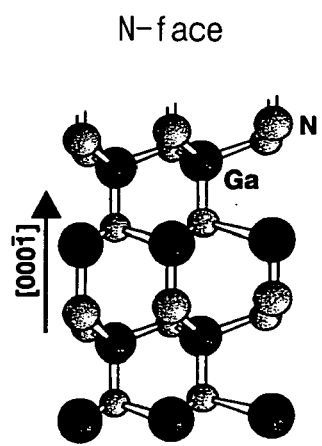 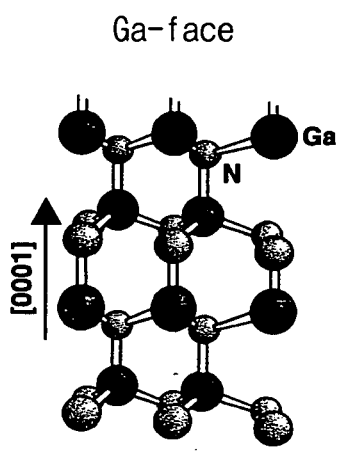

[FIG. 4]
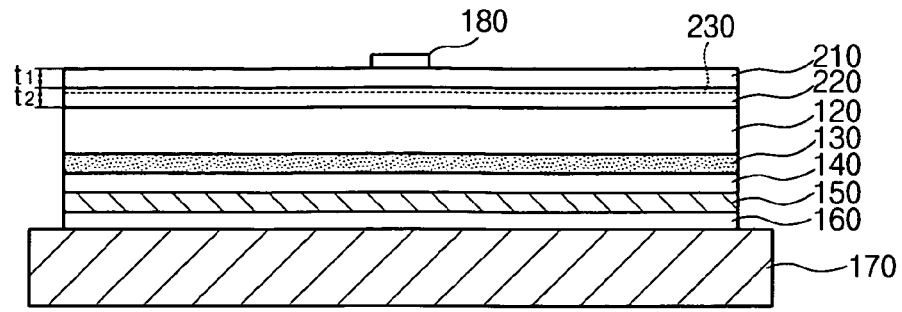
[FIG. 5]
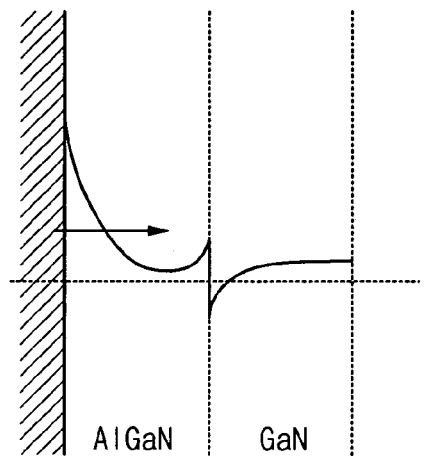
[FIG. 6]
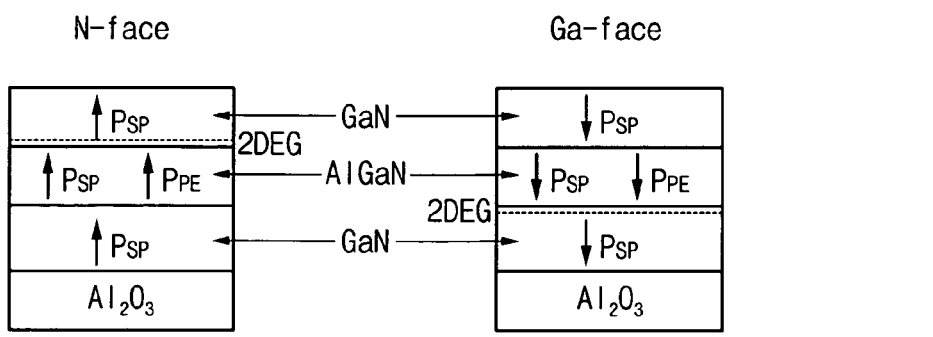
[FIG. 7A]
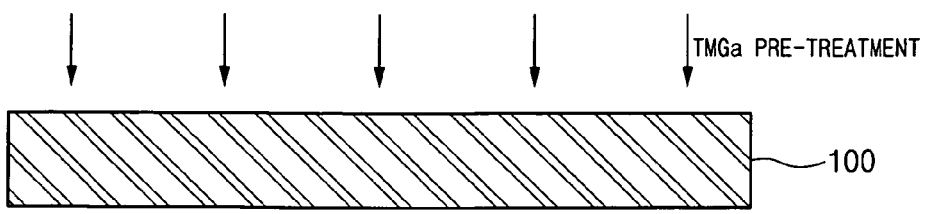

[FIG. 7B]
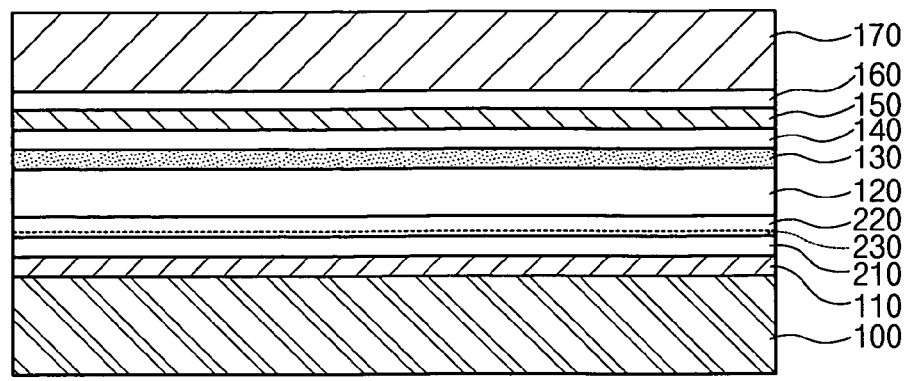
[FIG. 7C]
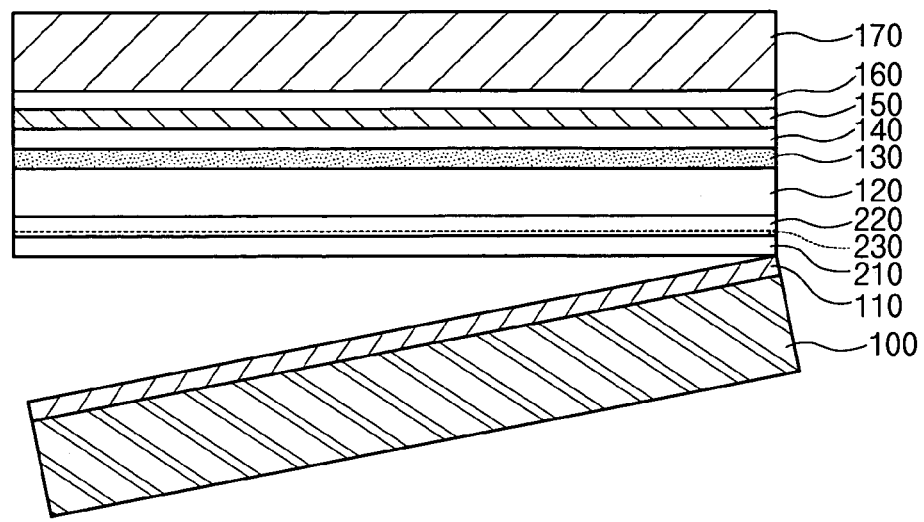
[FIG. 7D]
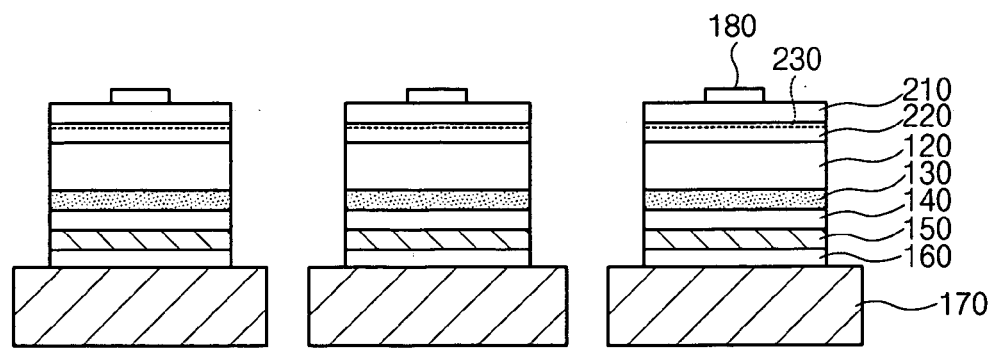

VERTICAL GAN-BASED LED AND METHOD OF MANUFACTURING THE SAME

CROSS-REFERENCE TO RELATED APPLICATIONS

This application claims the benefit of Korean Patent Application No. 2005-0066616 filed with the Korea Industrial Property Office on Jul. 22, 2005, the disclosure of which is incorporated herein by reference.

BACKGROUND OF THE INVENTION

1. Field of the Invention

The present invention relates to a vertical (i.e., vertical-electrode type) GaN-based light emitting diode (LED) and a method of manufacturing the same. In the vertical GaN-based LED, when a negative electrode (n-electrode) contacts an n-type GaN layer from which a sapphire substrate has been removed by a laser lift-off (LLO) process, a contact resistance and an operating voltage are reduced to enhance a current diffusion effect.

2. Description of the Related Art

Generally, a GaN-based LED is grown on a sapphire substrate, but the sapphire substrate is a rigid nonconductor and has poor thermal conductivity. Therefore, there is a limit in reducing the manufacturing costs by reducing the size of a GaN-based LED, or improving chip characteristics such as optical power and electrostatic discharge (EDD). Particularly, because application of a high current is essential for achieving high power LED, it is important to solve a heat-sink problem of the LED. To solve this problem, there has been proposed a vertical GaN-based LED in which a sapphire substrate is removed using a laser lift-off (LLO) process. Hereinafter, a vertical GaN-based LED according to the related art will be described with reference to FIGS. 1 and 2.

FIGS. 1 and 2 are sectional views illustrating a method of manufacturing a vertical GaN-based LED according to the related art.

Referring to FIG. 1, a buffer layer 110, an n-type GaN layer 120, an active layer 130, and a p-type GaN layer 140 are sequentially grown on a sapphire substrate 100. A positive electrode (p-electrode) and/or a reflective layer 150 and a conductive adhesive layer 160 are sequentially formed on the p-type GaN layer 140.

Thereafter, a predetermined temperature and a predetermined pressure are applied to the conductive adhesive layer 160, thereby attaching a silicon substrate 170 onto the conductive adhesive layer 160. The silicon substrate 170 may be replaced by a copper tungsten (CuW) substrate or a metal substrate. The metal substrate can also be referred to as "metal structure support layer".

Referring to FIG. 2, an LLP process is performed to sequentially remove the sapphire substrate 100 and the buffer layer 110, thereby exposing the top surface of the n-type GaN layer 120.

Thereafter, an n-electrode 180 is formed on the exposed surface of the n-type GaN layer 120, and laser scribing, wet etching, or dry etching is used to perform a device isolation process. Alternatively, the n-electrode 180 may be formed after the device isolation layer.

However, in the vertical GaN-based LED according to the LLO process, the surface of the sapphire substrate 100 is pre-treated using ammonia ($NH_3$) gas before the buffer layer 110 is grown on the sapphire substrate 100. Therefore, the exposed surface of the n-type GaN layer 120 is formed to have the structure of a GaN polarity with the [000-1] direction of a wurtzite structure, that is, the structure of an N-face polarity in which gallium elements are disposed on a vertical uppermost layer of nitride (N) elements (see FIG. 3(a)).

When the n-electrode 180 containing aluminum (Al) is formed on the surface of the n-type GaN layer 120 with the N-face polarity, an AlN layer serving as a piezoelectric layer is formed at an interface between the n-type GaN layer 120 and the n-electrode 180.

However, when the AlN layer is formed at the interface between the n-type GaN layer 120 and the n-electrode 180, a piezoelectric effect is directed toward the n-electrode, thereby increasing the contact resistance. This is well known to those skilled in the art by many conventional documents (see APPLIED PHYSICS LETTERS Vol. 79 (2001), pp 3254-3256, "Crystal-polarity dependence of Ti/Al contacts to freestanding n-GaN substrate" and APPLIED PHYSICS LETTERS Vol. 80 (2002), pp 3955-3957, "Characterization of band bendings on Ga-face and N-face GaN films grown by metalorganic chemical-vapor deposition").

Also, the n-type GaN layer 120 is formed by implantation of n-type impurities (e.g., Si) into an undoped GaN layer and thus has a high doping concentration.

However, when the n-type GaN layer 120 has a high doping concentration, current crowding occurs only at a lower portion of the n-electrode 180 contacting the n-type GaN layer 120 and a current does not diffuse over the entire active layer 130. Consequently, the light-generation efficiency of the LED is degraded and the lifespan of the LED is reduced.

SUMMARY OF THE INVENTION

An advantage of the present invention is that it provides a vertical GaN-based LED, in which a surface polarity of a GaN-based semiconductor layer contacting an n-electrode is controlled to reduce the contact resistance and the operating voltage, and a current diffusion effect is enhanced to obtain the high-output characteristics.

The present invention also provides a method of manufacturing the vertical GaN-based LED.

Additional aspect and advantages of the present general inventive concept will be set forth in the description which follows and, in part, will be obvious from the description, or may be learned by practice of the general inventive concept.

According to an aspect of the invention, a vertical GaN-based LED includes: an n-electrode; an AlGaN layer formed under the n-electrode; an undoped GaN layer formed under the AlGaN layer to provide a two-dimensional electron gas (2DEG) layer to a junction interface of the AlGaN layer; a GaN-based LED structure including an n-type GaN layer, an active layer, and a p-type GaN layer that are sequentially formed under the undoped GaN layer; a p-electrode formed under the GaN-based LED structure; and a conductive substrate formed under the p-electrode.

According to another aspect of the invention, the surface of the AlGaN layer contacting the n-electrode has a Ga-face structure in which nitrogen nitride (N) elements are disposed on a vertical uppermost layer of gallium (Ga) elements. Accordingly, the contact resistance of the n-electrode can be reduced. Also, a piezoelectric effect is directed toward the AlGaN layer, i.e., the opposite direction of the n-electrode, thereby greatly enhancing the current diffusion effect of the 2DEG layer formed under the AlGaN layer.

According to a further aspect of the invention, the vertical GaN-based LED further includes a conductive junction layer formed on the p-electrode or at an interface between the p-electrode and the conductive substrate.

According to a still further aspect of the invention, the undoped GaN layer has a thickness of 50-500 Å. The AlGaN layer is preferably formed to have an Al content of 10-50% for crystallinity. In this case, the AlGaN layer is formed to a thickness of 50-500 Å to provide the 2DEG layer.

According to a still further aspect of the invention, the AlGaN layer is an undoped AlGaN layer or a doped AlGaN layer doped with n-type impurities such as silicon impurities.

According to a still further aspect of the invention, the AlGaN layer contains silicon or oxygen as impurities. The oxygen can acts as a donor such as Si. The AlGaN layer may be naturally oxidized to contain oxygen. Alternatively, the AlGaN layer may be intentionally annealed at an oxygen atmosphere to contain a sufficient amount of oxygen.

According to a still further aspect of the present invention, a method of manufacturing a vertical GaN-based LED, the method including: forming a GaN-based buffer layer on a sapphire substrate; forming an undoped GaN layer on the GaN-based buffer layer to obtain crystallinity; forming an AlGaN layer on the undoped GaN layer; forming an undoped GaN layer on the AlGaN layer so as to form a 2DEG layer at a junction interface of the AlGaN layer; sequentially forming an n-type GaN layer, an active layer, and a p-type GaN layer on the undoped GaN layer to form a GaN-based LED structure; forming a p-electrode on the GaN-based LED structure; attaching a conductive substrate onto the p-electrode; removing the sapphire substrate and the GaN-based buffer layer through a laser lift-off (LLO) process, and removing the undoped GaN layer from the AlGaN layer through a chemical mechanical polishing (CMP) process; and forming an n-electrode on the AlGaN layer from which the undoped GaN layer has been removed.

According to a still further aspect of the invention, the method further includes, before the forming of the GaN-based buffer layer on the sapphire layer, performing a pre-treatment process on the sapphire layer such that the GaN-based buffer layer's surface contacting a top surface of the sapphire substrate has a Ga-face structure in which nitrogen (N) elements are disposed on a vertical uppermost layer of gallium elements. This aims that the AlGaN layer's surface contacting the n-electrode can have a Ga-face structure in which N elements are disposed on a vertical uppermost layer of Ga elements.

According to a still further aspect of the present invention, the pre-treatment process is performed for 30 seconds through 120 seconds using Trimethylgallium (TMGa).

According to a still further aspect of the present invention, the method further includes annealing the AlGaN layer in an oxygen atmosphere after the forming of the AlGaN layer.

According to a still further aspect of the present invention, the method further includes forming a reflective layer on the p-electrode before the attaching of the conductive substrate onto the p-electrode.

According to the present invention, the 2DEG layer structure is formed on the n-type GaN layer so as to reduce the contact resistance of a GaN semiconductor layer contacting the n-electrode. In particular, the top surface of the AlGaN layer (i.e., the uppermost layer of the 2DEG layer structure), that is, the AlGaN layer's surface contacting the n-electrode is formed to have a Ga-face. Accordingly, a piezoelectric effect is directed toward the AlGaN layer, i.e., the opposite direction of the n-electrode, thereby making it possible to greatly enhancing the current diffusion effect while reducing the contact resistance.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 and 2 are sectional views illustrating a method of manufacturing a vertical GaN-based LED according to the related art;

FIG. 3 is a crystal structure diagram illustrating a GaN polarity of a wurtzite structure;

FIG. 4 is a sectional view of a vertical GaN-based LED according to an embodiment of the present invention;

FIG. 5 is an energy band diagram illustrating an AlGaN/GaN hetrojunction band structure used in the vertical GaN-based LED of FIG. 4;

FIG. 6 is a diagram illustrating the position of a 2DEG layer and the direction of an electric field according to the GaN polarity of the wurtzite structure; and FIGS. 7A to 7D are sectional views illustrating a method of manufacturing a vertical GaN-based LED according to an embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. In the drawings, the thicknesses of layers and regions are exaggerated for clarity. The embodiments are described below in order to explain the present general inventive concept by referring to the figures.

Hereinafter, preferred embodiments of the present invention will be described in detail with reference to the accompanying drawings.

Structure of Vertical GaN-based LED

The structure of a vertical GaN-based LED according to an embodiment of the present invention will be described in detail with reference to FIGS. 4 to 6.

FIG. 4 is a sectional view of a vertical GaN-based LED according to an embodiment of the present invention. FIG. 5 is an energy band diagram illustrating an AlGaN/GaN hetrojunction band structure used in the vertical GaN-based LED illustrated in FIG. 4. FIG. 6 is a diagram illustrating the position of a two-dimensional electron gas layer (2DEG) layer and the direction of an electric field according to the GaN polarity of the wurtzite structure.

Referring to FIG. 4, an n-electrode 180 is formed in the uppermost portion of the vertical GaN-based LED. The n-electrode 180 may be formed of Ti/Al.

A heterogeneous AlGaN layer 210 and an undoped GaN layer 220 are sequentially stacked under the n-electrode 180 to form an AlGaN/GaN hetrojunction structure. This reduces a contact resistance of the n-electrode 180 and enhances a current diffusion effect.

Hereinafter, the AlGaN/GaN hetrojunction structure will be described in detail with reference to FIG. 5.

Referring to FIG. 5, the undoped GaN layer 220 has a 2DEG layer 230 at an interface thereof due to an energy band discontinuity with respect to the AlGaN layer 210. The 2DEG layer 230 provides a high carrier mobility of about 1500 $cm^2/Vs$, thereby enhancing the current diffusion effect greatly.

The desirable formation conditions of the 2DEG layer 230 may be determined by the thickness "t1" of the AlGaN layer 210, the thickness "t2" of the undoped GaN layer 220, and the Al content of the AlGaN layer 210.

It is preferable that the thickness "t1" of the undoped GaN layer 220 is about 50-500 Å. In this embodiment, the undoped GaN layer 220 is formed to have a thickness of 80-200 Å.

The thickness "t1" of the AlGaN layer 210 may vary depending on the Al content of the AlGaN layer 210. However, the crystallinity of the AlGaN layer 210 may be degraded when the Al content of the AlGaN layer 210 is high. Therefore, it is preferable that the Al content of the AlGaN layer 210 is 10-50%. In this Al content condition, it is preferable that the thickness of the AlGaN layer 210 ranges from 50 to 500 Å. In this embodiment, the AlGaN layer 210 is formed to a thickness of 50-350 Å.

The AlGaN layer 210 for forming the 2DEG layer 230 may be an n-type AlGaN layer or an undoped AlGaN layer. The n-type AlGaN layer may be formed using n-type impurities such as silicon (Si).

Although the 2DEG layer 230 formed by the GaN/AlGaN layer structure guarantees a relatively high sheet carrier concentration of about $1013/cm^2$, impurities such as oxygen may be additionally used to increase the sheet carrier concentration.

According to the present invention, the AlGaN/GaN hetrojunction structure is formed between a bottom surface of the n-electrode 180 and a top surface of an n-type GaN layer 120 that will be described later. Accordingly, the problem of current crowding can be greatly improved by the current diffusion effect of the 2DEG layer 230.

In general, when an AlGaN layer is grown on a GaN layer in a GaN/AlGaN hetrojunction structure, the AlGaN layer is smaller in lattice constant than the GaN layer and thus undergoes a tensile strain due to lattice mismatch, causing polarization due to a piezoelectric effect.

However, the direction of the polarization due to the piezoelectric effect varies depending on the crystal direction of the GaN/AlGaN layers, i.e., the polarity of the GaN layer, which also changes the direction of electron distribution of the 2DEG layer 230.

Hereinafter, the GaN polarity of the AlGaN layer's surface contacting the n-electrode, i.e., the characteristics of the GaN/AlGaN hetrojunction structure according to the N-face and the Ga-face will be described in detail with reference to FIGS. 3 and 6.

Referring to FIG. 3, the GaN polarity of the wurtzite structure is divided into a [000-1] N-face in which gallium (Ga) elements are disposed on a vertical uppermost layer of nitride (N) elements as illustrated in FIG. 3(a) and a [0001] Ga-face in which N elements are disposed on a vertical uppermost layer of Ga elements as illustrated in FIG. 3(b). The [000-1] Ga-face has a crystal growth direction opposite to that of the [000-1] N-face. The [0001] Ga-face is superior in surface planarity to the [000-1] N-face.

The formation position of the 2DEG layer in the GaN/AlGaN hetrojunction structure varies depending on the surface polarity of the AlGaN layer contacting the n-electrode, as illustrated in FIG. 6. When the surface of the AlGaN layer has the N-face, the 2DEG layer is formed on the AlGaN layer as illustrated in FIG. 6(a). On the other hand, when the surface of the AlGaN layer has the Ga-face, the 2DEG layer is formed under the AlGaN layer as illustrated in FIG. 6(b).

As described above, when the surface of the AlGaN layer has the N-face as illustrated in FIG. 6(a), the piezoelectric effect is formed upwardly from the AlGaN layer contacting the n-electrode, which causes an adverse effect that reduces the concentration of the 2DEG layer.

Accordingly, in this embodiment, the surface of the AlGaN layer 210 in the GaN/AlGaN hetrojunction structure is preferably formed to have the Ga-face in which N elements are disposed on the vertical uppermost layer of Ga elements. Consequently, the concentration of the 2DEG layer can be increased and thus the current diffusion effect can be enhanced more greatly.

An n-type GaN layer 120, an active layer 130, and a p-type GaN layer 140, which constitute a GaN-based LED structure, are sequentially stacked under the undoped GaN layer 220 composing the AlGaN/GaN hetrojunction structure.

The n-type GaN layer 120 and the p-type GaN layer 140 in the GaN-based LED structure may be a GaN layer or a GaN/AlGaN layer that is doped with impurities of the corresponding conductivity type. The active layer 130 may be a multi-quantum well structure formed of an InGaN/GaN layer.

A p-electrode 150 is formed under the p-type GaN layer 140 of the GaN-based LED structure. Although not illustrated in FIG. 4, a reflective layer may be additionally formed under the p-electrode 150. In case where the reflective layer is not formed, the p-electrode 150 serves as the reflective layer.

A conductive substrate 170 is attached onto a bottom surface of the p-electrode by a conductive junction layer 160. The conductive substrate 170 serves as an electrode or a support layer of the final LED. The conductive substrate 170 may include a Si substrate, a GaAs substrate, a Ge substrate, or a metal layer. The metal layer may be formed by electrolytical plating, electrodeless plating, thermal evaporation, e-beam evaporation, sputtering, or chemical vapor deposition (CVD).

Method of Manufacturing Vertical GaN-based LED

A method of manufacturing a vertical GaN-based LED according to an embodiment of the present invention will be described in detail with reference to FIGS. 7A to 7D.

FIGS. 7A to 7D are sectional views illustrating a method of manufacturing a vertical GaN-based LED according to an embodiment of the present invention.

Referring to FIG. 7A, a pre-treatment process is performed on the surface of a substrate 100 using Trimethylgallium (TMGa). Preferably, the pre-treatment process is performed to spray TMGa onto the surface of the substrate 100 for 30 second to 120 seconds. This aims that the surface of a GaN-bases buffer layer, which will be formed by a subsequent process to contact the substrate 100, can have the Ga-face structure in which N elements are disposed on the vertical uppermost layer of Ga elements. The substrate 100 may be any substrate that is suitable for growing the single crystal of a nitride semiconductor. For example, the substrate 100 may be a homogeneous substrate, such as a sapphire substrate and a silicon carbide (SiC) substrate, or a heterogeneous substrate, such as a nitride semiconductor substrate.

Referring to FIG. 7B, a well-known nitride deposition process, such as MOCVD and MBE, is performed to sequentially grow a GaN-based buffer layer 110 and an undoped GaN layer (not shown) on the substrate 100. The undoped GaN layer formed on the GaN-based buffer layer 110 aims at providing the crystallinity of a layer to be formed by a subsequent process.

Thereafter, an AlGaN layer 210 and an undoped GaN layer 220 are sequentially stacked on the undoped GaN layer (not shown), which constitute a hetrojunction structure.

The AlGaN layer 210 and the undoped GaN layer 220 may be successively formed in a chamber for the nitride deposition process. Preferably, the undoped GaN layer 220 is formed to have a thickness of 50-500 Å for formation of a 2DEG layer 230. Preferably, the AlGaN layer 210 is formed to have a thickness of 50-500 Å considering a desirable Al content of the AlGaN layer 210. Preferably, the Al content of the AlGaN layer 210 is limited to the range of 10-50% so as to prevent crystallinity degradation due to an excessive AL content.

The AlGaN layer 210 may be an n-type AlGaN layer doped with n-type impurities such as Si. Alternatively, the AlGaN layer 210 may be an undoped AlGaN layer.

Thereafter, an n-type GaN layer 120, an active layer 130, and a p-type GaN layer 140 are sequentially grown on the undoped GaN layer 220 of the hetrojunction structure, thereby forming a GaN-based LED structure. Because the surface of the substrate 10 is pre-treated with TMGa, the surface of the buffer layer 110 contacting the substrate 100 has the [0001] Ga-face illustrated in FIG. 3(b).

Thereafter, a p-electrode 150 is formed on the p-type GaN layer 140. The p-electrode 150 may serve as a reflective layer. Alternatively, a separate reflective layer (not shown) may be further formed on the p-electrode 150.

Thereafter, a conductive junction layer 160 is formed on the p-electrode 150. The conductive junction layer 160 is formed to attach a conductive substrate 170 by eutectic bonding.

Thereafter, a predetermined temperature and a predetermined pressure are applied to attach the conductive substrate 170 onto the conductive junction layer 160. At this point, the conductive substrate 170 serves as an electrode or a support layer of the final LED. The conductive substrate 170 may include a Si substrate, a GaAs substrate, a Ge substrate, or a metal layer. The metal layer may be formed by electrolytical plating, electrodeless plating, thermal evaporation, e-beam evaporation, sputtering, or CVD.

Referring to FIG. 7C, an LLO process is performed to remove the sapphire substrate 100 and the buffer layer 110. Thereafter, a CMP process is performed to remove the undoped GaN layer (not shown), thereby exposing the surface of the AlGaN layer 210. Because the surface of the buffer layer 110 contacting the substrate 100 pre-treated with TMGa has the Ga-face polarity, the exposed surface of the AlGaN layer 210 grown on the buffer layer 110 also has the Ga-face polarity.

Referring to FIG. 7D, an n-electrode 180 is formed on the exposed surface of the AlGaN layer 210. Thereafter, laser scribing, wet etching, or dry etching is used to perform a device isolation process, thereby forming the vertical GaN-based LED. Alternatively, the n-electrode 180 is formed after the device isolation process, thereby forming the vertical GaN-based LED.

As described above, according to the present invention, the hetrojunction structure of the AlGaN/undoped GaN is formed between the n-electrode and the n-type GaN layer to create the 2DEG layer. Accordingly, the contact resistance of the n-type GaN layer is minimized, thereby making it possible to reduce the operating voltage of the vertical GaN-based LED and to enhance the current diffusion effect.

The 2DEG layer can guarantee high carrier mobility and high carrier concentration, thereby creating an excellent effect in current injection efficiency.

The AlGaN layer's surface contacting the n-electrode is formed to have the Ga-face polarity with the [0001] direction of the wurtzite structure, thereby further reducing the contact resistance of the n-electrode and increasing the concentration of the 2DEG layer by the piezoelectric effect due to the Ga-face polarity. Accordingly, the current diffusion effect is further enhanced, thereby making it possible to provide the vertical GaN-based LED with high-output characteristics.

Consequently, the present invention makes it possible to enhance the characteristics and reliability of the vertical GaN-based LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A vertical GaN-based light emitting diode (LED) comprising:
   an n-electrode;
   an AlGaN layer formed under the n-electrode;
   an undoped GaN layer formed under the AlGaN layer to provide a two-dimensional electron gas (2DEG) layer to a junction interface of the AlGaN layer;
   a GaN-based LED structure including an n-type GaN layer, an active layer, and a p-type GaN layer that are sequentially formed under the undoped GaN layer;
   a p-electrode formed under the GaN-based LED structure; and
   a conductive substrate formed under the p-electrode.

2. The vertical GaN-based LED according to claim 1, wherein the surface of the AlGaN layer contacting the n-electrode has a Ga-face structure in which nitrogen (N) elements are disposed on a vertical uppermost layer of gallium elements.

3. The vertical GaN-based LED according to claim 1, further comprising a conductive junction layer formed on the p-electrode or at an interface between the p-electrode and the conductive substrate.

4. The vertical GaN-based LED according to claim 1, further comprising a reflective layer formed under the p-electrode.

5. The vertical GaN-based LED according to claim 1, wherein the undoped GaN layer has a thickness of 50-500 Å.

6. The vertical GaN-based LED according to claim 1, wherein the AlGaN layer has an Al content of 10-50%.

7. The vertical GaN-based LED according to claim 1, wherein the AlGaN layer has a thickness of 50-500 Å.

8. The vertical GaN-based LED according to claim 1, wherein the AlGaN layer is an undoped AlGaN layer.

9. The vertical GaN-based LED according to claim 1, wherein the AlGaN layer is a doped AlGaN layer doped with n-type impurities.

10. The vertical GaN-based LED according to claim 1, wherein the AlGaN layer is doped with silicon impurities or oxygen impurities.

* * * * *